(12) United States Patent
Zhang et al.

(10) Patent No.: US 8,222,805 B2
(45) Date of Patent: Jul. 17, 2012

(54) OXYNITRIDE LUMINESCENT MATERIAL, PREPARATION METHOD AND ITS APPLICATIONS

(75) Inventors: Xiaoling Zhang, Beijing (CN); Haisong Wang, Beijing (CN); Xiangyang Lin, Beijing (CN); Peng Bao, Beijing (CN)

(73) Assignee: Beijing Yuji Science and Technology Co., Ltd., Beijing (CN)

( * ) Notice: Subject to any disclaimer, the term of this patent is extended or adjusted under 35 U.S.C. 154(b) by 0 days.

(21) Appl. No.: 12/667,470

(22) PCT Filed: Apr. 9, 2008

(86) PCT No.: PCT/CN2008/070691
§ 371 (c)(1),
(2), (4) Date: Dec. 31, 2009

(87) PCT Pub. No.: WO2009/003378
PCT Pub. Date: Jan. 8, 2009

(65) Prior Publication Data
US 2010/0187974 A1    Jul. 29, 2010

(30) Foreign Application Priority Data
Jul. 2, 2007  (CN) .......................... 2007 1 0118199

(51) Int. Cl.
*H05B 33/00*  (2006.01)
*H01J 9/00*  (2006.01)
(52) U.S. Cl. ........... 313/503; 313/512; 445/23; 428/690
(58) Field of Classification Search .......... 313/498–503, 313/512; 428/690; 445/23–25
See application file for complete search history.

(56) References Cited

U.S. PATENT DOCUMENTS

| 6,717,353 | B1 | 4/2004 | Mueller et al. |
| 7,258,816 | B2 | 8/2007 | Tamaki et al. |
| 2006/0001352 | A1 | 1/2006 | Maruta et al. |
| 2006/0076883 | A1 | 4/2006 | Himaki et al. |

FOREIGN PATENT DOCUMENTS

CN    1337989 A    2/2002
(Continued)

OTHER PUBLICATIONS

International Search Report for PCT Counterpart Application No. PCT/CN2008/070691, 4 pgs (May 8, 2008).
PCT Written Opinion of the International Searching Authority for PCT Counterpart Application No. PCT/CN2008/070691, 6 pgs., (Jul. 10, 2008).

(Continued)

*Primary Examiner* — Joseph L Williams

(57) ABSTRACT

The present invention relates to semiconductor field, especially relates to an oxynitride luminescent material, preparation method and its application. The oxynitride has a chemical formula of $A_xB_yO_zN_{2/3x+4/3y-2/3z}$:R, wherein A is one or more elements selected from the group consisting of Be, Mg, Ca, Sr, Ba, and Zn; B is one or more elements selected from the group consisting of Si, Ge, Zr, Ti, B, Al, Ga, In, Li, and Na, and at least contains Si. The oxynitride luminescent material according to the invention is excellent in chemical stability and luminescence property, and act as cyan to red luminescent material applicable to white light LED that excited by ultraviolet or blue light LED. Its excited wavelength is between 300-500 nm, while the emission wavelength at 470-700 nm. With blue or ultraviolet or near-ultraviolet LED, this type of material can be used to produce white light illumination or display light source.

11 Claims, 7 Drawing Sheets

FOREIGN PATENT DOCUMENTS

| | | |
|---|---|---|
| CN | 1522291 A | 8/2004 |
| CN | 1705732 A | 12/2005 |
| CN | 1927996 | 3/2007 |
| JP | 2005-093912 A | 4/2005 |
| JP | 2007-126536 A | 5/2007 |
| WO | WO 01/39574 A1 | 6/2001 |
| WO | WO 03/080764 A1 | 10/2003 |
| WO | WO 2004/030109 A1 | 4/2004 |

OTHER PUBLICATIONS

PCT International Preliminary Report on Patentability (Chapter I of the Patent Cooperation Treaty) for PCT Counterpart Application No. PCT/CN2008/070691, 7 pgs., (Jan. 5, 2010).

Office Action for Chinese Patent Application No. 2007101181998, 6 pgs., mailed Apr. 24, 2009.

Office Action for Chinese Patent Application No. 2007101181998, 4 pgs., mailed Feb. 12, 2010.

OXYNITRIDE LUMINESCENT MATERIAL, PREPARATION METHOD AND ITS APPLICATIONS

This application is a U.S. National Phase application under 35 U.S.C. §371 of International Application No. PCT/CN2008/070691, filed Apr. 9, 2008, entitled "A Nitrogen Oxide Luminescent Material, Producing Method and Application of the Same", which claims the priority to Chinese patent application No. 200710118199.8, filed Jul. 2, 2007. The disclosure of the above-identified applications is incorporated by reference herein in its entirety.

TECHNICAL FIELD

The present invention relates to semiconductor field, especially relates to an oxynitride luminescent material, its preparation method and application in illumination.

BACKGROUND

GaN-based LED (light-emitting Diode) is a kind of novel luminescent device known as solid state light source in 21 century, which possesses many advantages such as compactness, low energy-consumption, long Life of permanence, free of mercury, high efficiency, and low ratio of service. It can be used widely in a variety of lighting fixtures including interior illumination, traffic signal/indicator lamp, automobile tail light/head light, large scale screen used outdoors, display screen and advertisement screen, and trends to replace bulb and fluorescent lamp that used currently. The novel environment-friendly light source will dominate the development of the lighting system and play an important role in energy-saving, environmental protection, and improvement of the life quality. The fabrication technique comprises mainly (1) combination of three kinds of monochromatic LED (blue, green, red); (2) combination of blue light LED with yellow fluorescent powder; (3) combination of ultraviolet LED with trichromatic red-green-blue fluorescent powder. However, inorganic luminescent material that can be excited effectively by blue-light LED is seldom. Presently, white light is mainly obtained based on complementary color theory through the combination of YAG:Ce fluorescent material of Yttrium-Aluminium-Garnet structure with blue light LED. Since the light emitted from YAG is yellow-green, however, the obtained white light is characterized to have high color temperature and cool tone so that the coloration indexing is not satisfactory. As a result, green, yellow or red fluorescent powder is added to acquire white light with different color temperature (from cool tone to warm tone) and improve the coloration indexing.

Presently, most of the red fluorescent material that can be excited by blue light (420-480 nm) is sulfide doped with bivalent europium, for example, $(Ca,Sr,Ba)S:Eu^{2+}$. And most of the green fluorescent material that can be excited by blue light (420-480 nm) is sulfide doped with bivalent europium, for example, $(Ca,Sr,Ba)GaS_4:Eu^{2+}$. But, sulfide fluorescent powder is active and unstable thermally, it tends to react with the water in air and decompose while heated. In addition, the environment will be polluted by waste gas exhaust during the production of sulfide. Employment of nitride, formed of $SiN_4$ units, as the matrix of fluorescent powder attaches considerable attention recently. While doped with rare-earth element such as europium, due to the strong covalent link and big crystal field splitting, this type of compound can emit light with large wavelength such as yellow, orange and red light. European patent (PCT/EP2000/012047) described a red fluorescent powder $M_2Si_5N_8:Eu^{2+}$ (M=Ca, Sr, Ba) and the preparation method thereof. The fluorescent powder is stable chemically and thermally, and can be excited by blue light. Otherwise, luminescent intensity of said fluorescent powder needs to be improved.

SUMMARY OF THE DESCRIPTION

Point to the above-mentioned drawbacks, the object of the present invention is to regulate luminescence property and develop novel fluorescent material through varying the ambience surrounding the luminescence center atom by, for example, selecting suitable host material and designing ligand field or crystal field. The present invention is to provide a cyan to red luminescent material of oxynitride, with stable chemical behaviour and excellent luminescence property, and applicable to white light LED that excited by ultraviolet or blue light LED. Its excited wavelength is between 300-500 nm, while the emission wavelength at 470-700 nm. Another object of the present invention is to provide a preparation method for the luminescent material, which is easy to operate, easy to realize quantity production, pollution-free, and of low cost. Uniform fluorescent powders, exhibiting high luminescent intensity, with particle size less than 10 μm could be obtained in the method.

Another object of the present invention is to provide white light LED illumination or display light source which is made from the above-mentioned luminescent material with blue or ultraviolet or near-ultraviolet LED.

An oxynitride luminescent material represented by the following chemical formula:

$$A_xB_yO_zN_{2/3x+4/3y-2/3z}:R,$$

Wherein

A represents one or more element selected from bivalent metal;

B represents one or more element selected from the group consisting of Si, Ge, Zr, Ti, B, Al, Ga, In, Li and Na, and contains at least Si;

R is luminescence center element and comprises one or more element selected from the group consisting of Eu, Ce, Mn, and Bi;

$$1.0 \leq x \leq 3.0;\ 1.0 \leq y \leq 6.0;\ 0 \leq z \leq 2.0.$$

In one embodiment, said A is one or more element selected from the group consisting of Be, Mg, Ca, Sr, Ba, and Zn.

In one embodiment, said A is Ca or combination of Ca with Sr, said B is Ga or combination of Ga with Al.

A preparation method for the oxynitride luminescent material, comprises the following steps:

(1) select oxide, nitride, nitrate or carbonate of A, nitride or oxide of B, and nitride, oxide or nitrate of R as raw material, then mix and grind them to obtain a homogeneous mixture;

(2) sinter the mixture obtained in step (1) under inert gas atmosphere at elevated temperature, a sintered product is given during the solid state reaction process, (3) generate the oxynitride luminescent material by shattering, removing the involved impurity, drying, and classifying the sintered product obtained in step (2).

Anhydrous alcohol or n-hexane may be added in the course of said grind.

Said inert gas during the solid state reaction is a mixture of nitrogen gas and hydrogen gas at normal pressure, wherein the volume ratio of nitrogen gas to hydrogen gas is 95:5 and the flow rate is 0.1-3 L/min.

Said sinter is operated for 0.5-30 hours at 1200-1800° C. and may be conducted time after time.

Fluxing agent that is one or more compound selected from boric acid or halogenide of A may be added in step (1).

The amount of the fluxing agent is 0.01-10 percent of weight based on the total weight of the raw materials.

Said removing the involved impurity refers to acid washing or water washing.

A white light LED illumination or display light source, characterized in that it comprises ultraviolet or near-ultraviolet LED, and said oxynitride luminescent material.

A white light LED illumination or display light source, characterized in that it comprises blue light LED, and yellow luminescent material selected from the above-mentioned oxynitride.

A white light LED illumination or display light source, characterized in that it comprises blue light LED, and red and green luminescent materials selected from the above-mentioned oxynitride.

A white light LED illumination or display light source, characterized in that it comprises blue light LED, red luminescent material selected from the above-mentioned oxynitride, and yellow luminescent material with Yttrium-Aluminium-Garnet crystal structure.

A oxynitride luminescent material according to the present invention, represented by chemical formula $A_xB_yO_zN_{2/3x+4/3y-2/3z}$:R, wherein A is one or more element selected from bivalent metal; B represents one or more element selected from the group consisting essentially of quadirivalent metal, and contains at least Si; R is luminescence center element and represents one or more element selected from the group consisting of Eu, Ce, Mn, and Bi; $1.0 \leq x \leq 3.0$; $1.0 \leq y \leq 6.0$; $0 \leq z \leq 2.0$. Different A, B, R, X, Y, and/or Z results in a series of oxynitride luminescent materials, which may emit cyan, green, yellow, or red light with the wavelength of 470-700 nm while excited by irradiation with the wavelength of 300-500 nm.

In the method according to the invention, the source of A can be oxide, carbonate, nitrate etc. besides nitride. All of the metal salts that can convert to metal oxide under high-temperature sintering may be used as the raw material. As a result, the range of the raw material is wide and the synthetic cost is decreased. In addition, the salts are stable so that extra treatment to the raw material is unnecessary. The reaction is easy to control and quantity production is easy to be realized. The luminescent material of the present invention is prepared by sintering nitride or oxide or carbonate or nitrate of A, oxide or nitride of B, and nitride or oxide or nitrate of R at high temperature. In the process of sintering, inert gas is added to (1) prevent some raw material nitride and reaction product from decomposing at high temperature and (2) act as reducing atmosphere. Said inert gas may be $N_2$ or a mixture gas of $N_2$ and $H_2$ wherein the volume ratio of $N_2$ to $H_2$ is 95:5, the flow rate is 0.1-3 L/min, and the inert gas can be of high pressure or normal pressure. Anhydrous alcohol or n-hexane may be added to make the mixture more uniformly during grinding, and boric acid or halogenide of A can be added as the fluxing agent before the high-temperature sintering. Moreover, after-treatment of the reaction comprises removing the impurity. After the high-temperature sintering, the impurity is normally oxide of A and/or B and/or R that can be removed through acid washing or water washing. Other impurity was converted to gas and volatilized.

The oxynitride luminescent material according to the present invention can emit cyan (refer to the light with 470-520 nm in wavelength, as shown for example in examples 31-41), green, yellow, or red light with 470-700 nm in wavelength under the excitation of light with 300-500 nm in wavelength. Thus it can be coated on blue light LED chip with other luminescent material to produce novel white light LED, or coated on ultraviolet or near-ultraviolet LED chip with other luminescent material to produce novel white light LED that exhibits high energy-conversion efficiency. It can also combine with blue light LED, ultraviolet LED or near-ultraviolet LED, or mix with other luminescent material to prepare color LED.

The preparation method of the invention is easy to operate, easy to realize quantity production, pollution-free, and of low cost. Changing the involved elements partly can realize the adjustment of wavelength and the improvement of luminescent intensity. The invention comprises the following advantages: (1) As the luminescent material, oxynitride is very stable and presents good temperature characteristic.

(2) The range of excited wavelength of the luminescent material is very wide (300-500 nm), and the excited effect is excellent. (3) The preparation method is easy to operate, easy to realize quantity production, and pollution-free. (4) White light LED according to the present invention has high coloration indexing, high luminescence efficiency, and wide color temperature scope.

DETAILED DESCRIPTION

The present invention will be described in details with reference to the following examples.

Example 1

The Preparation Example of Luminescent Material $Sr_{1.90}Mg_{0.06}Si_{4.80}Al_{0.20}O_{0.20}N_{7.80}$:$Eu_{0.04}$ Comparison Example 1

A compound $Sr_{1.96}Si_5N_8$:$Eu_{0.04}$ disclosed in European patent PCT/EP2000/012047. It's prepared by the involved method as a comparison.

Figure 1:
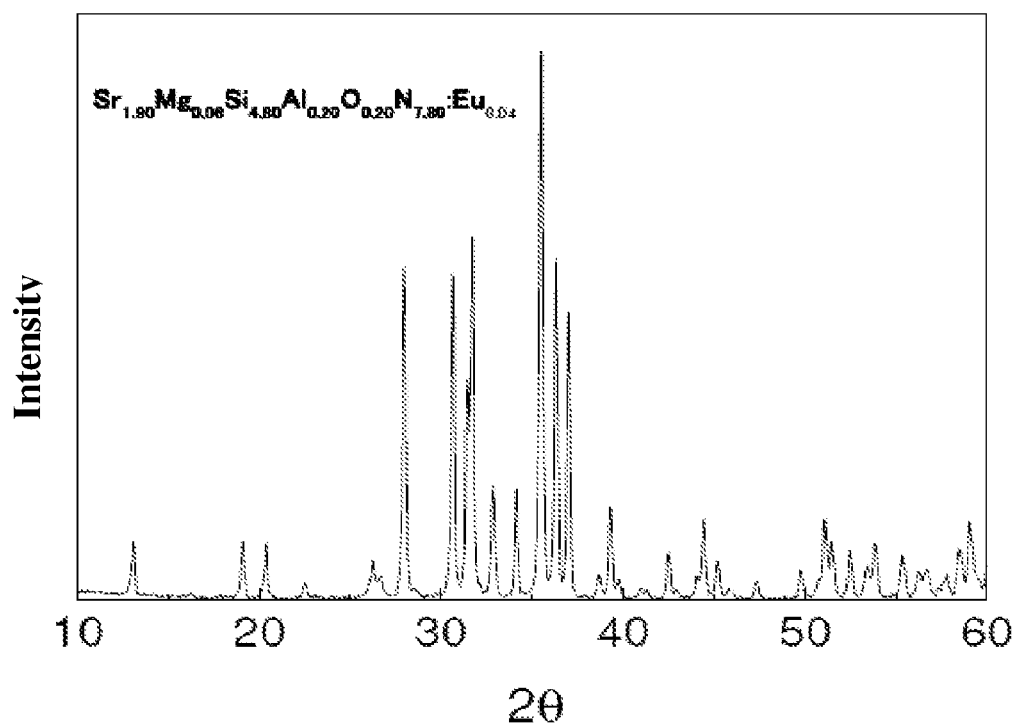
FIG. 1 is XRD pattern of example 1.
Figure 2:
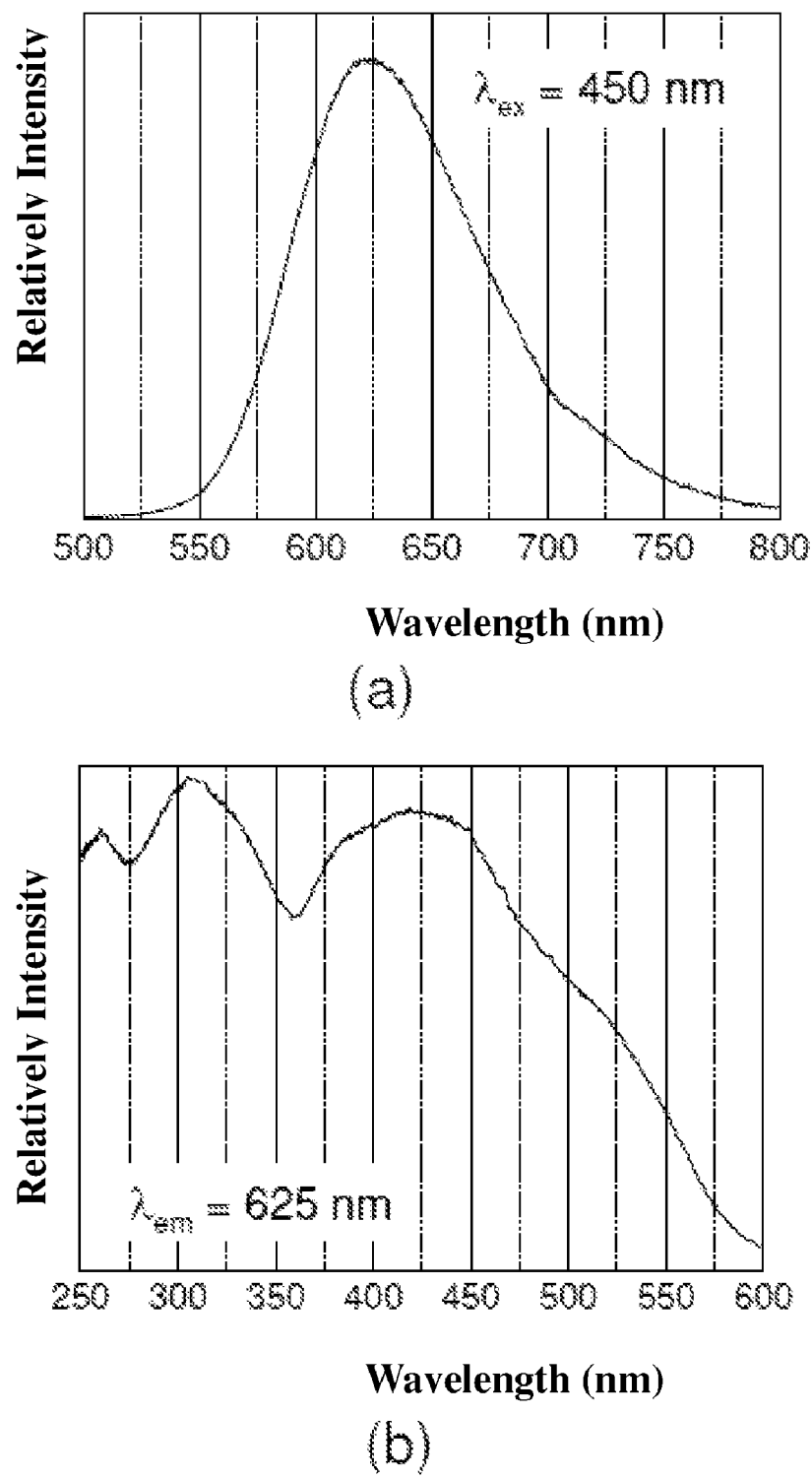
FIG. 2 is emission and excitation spectrum of example 1.
Figure 3:
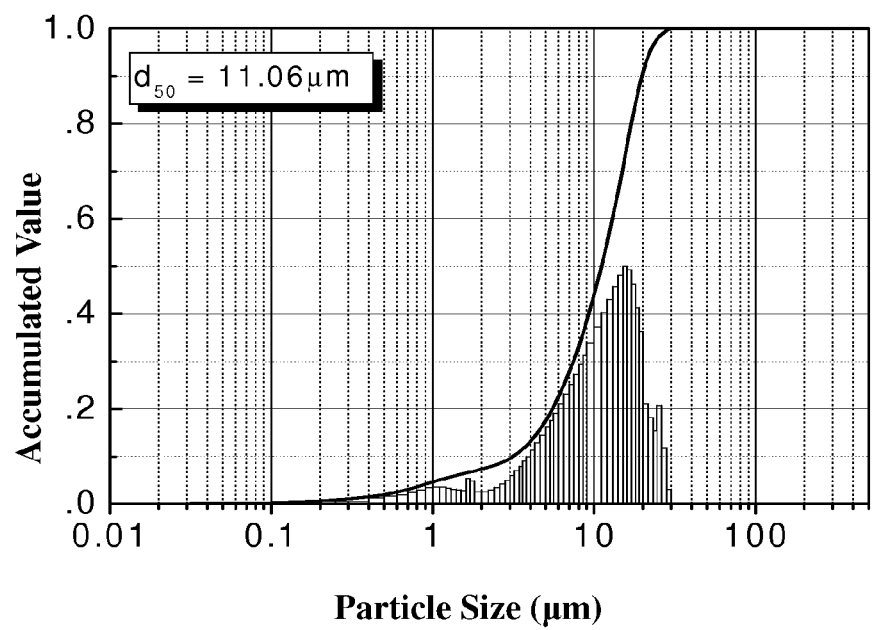
FIG. 3 illustrates particle size distribution of example 1.

According to the above-mentioned proportion, $Sr_3N_2$ (43.1932 g), $Mg_3N_2$ (0.4671 g), $Si_3N_4$ (52.3152 g), $Al_2O_3$ (2.3822 g) and $Eu_2O_3$ (1.6442 g) were added to a glove box, mixed and ground to uniform level. Then the obtained mixture was loaded in borazon crucible and sintered in a pipe furnace. At normal pressure $N_2/H_2$ (95%/5%) is introduced in with the flow rate 0.1 L/min. 0.1 g $SrF_2$ was used as the fluxing agent. After maintained at 1300° C. for 10 hours, the obtained powder was ground followed by being sintered at the same condition again to accelerate the growth of crystalline grain. The sample was shattered, washed by hydrochloric acid to remove the involved impurity, and dried, giving 100 g red luminescent material of the present invention. The XRD pattern of the product is illustrated in FIG. 1, indicating that the powder is mono-phase and $Mg^{2+}$, $Al^{3+}$ and $O^{2-}$ lies in the $Sr_2Si_5N_8$ lattice producing a solid solution. FIG. 2a is the emission spectrum while FIG. 2b is the excitation spectrum. As shown in FIG. 2a, the emission spectrum is wide and the full width at half maximum is about 30 nm, and the dominant peak occurs at about 625 nm that is in the region of red light. FIG. 2b illustrates that the excitation spectrum is so wide that it extends from ultraviolet region to visible-light region. As a result, the luminescent material can be excited effectively by ultraviolet light (300-420 nm) and blue light (420-490 nm) at the same time. The luminescent intensity is shown in table 1. As shown in table 1, the luminescent intensity of the luminescent material according to the present invention is stronger than or equal approximately to that of the sample in comparison example 1. FIG. 3 shows the particle size distribution of the product, which is narrow and indicates that the mesoposition particle size of the fluorescent powder is about 11 µm.

Example 2-7

The luminescent materials represented by the chemical formula listed in table 1 were synthesized through the same preparation process as example 1 except that the involved fluxing agent was chloride of A. The luminescent intensity of the obtained products is shown in table 1.

TABLE 1

Chemical formula of the products in example 1-7 and luminescence property thereof

| Example | Chemical formula | Dominant peak of emission (nm) | Relative intensity % |
|---|---|---|---|
| 1 | $Sr_{1.90}Mg_{0.06}Si_{4.80}Al_{0.20}O_{0.20}N_{7.80}:Eu_{0.04}$ | 625 | 124 |
| 2 | $Sr_{1.82}Ca_{0.10}Si_{4.90}Al_{0.10}O_{0.10}N_{7.90}:Eu_{0.04}, Mn_{0.04}$ | 623 | 136 |
| 3 | $Sr_{1.90}Zn_{0.06}Si_{4.80}Al_{0.20}O_{0.20}N_{7.80}:Eu_{0.04}$ | 618 | 113 |
| 4 | $Sr_{1.4}Ba_{0.5}Mg_{0.06}Si_{4.80}Al_{0.20}O_{0.20}N_{7.80}:Eu_{0.04}$ | 612 | 102 |
| 5 | $Sr_{1.86}Ba_{0.10}Si_{4.70}Ge_{0.1}Al_{0.20}O_{0.20}N_{7.80}:Eu_{0.04}$ | 627 | 109 |
| 6 | $Sr_{1.50}Ba_{0.40}Si_{4.80}B_{0.1}Al_{0.10}O_{0.20}N_{7.80}:Eu_{0.1}$ | 660 | 98 |
| 7 | $Sr_{1.72}Ca_{0.20}Si_{4.7}Al_{0.20}Ga_{0.1}O_{0.30}N_{7.70}:Eu_{0.08}$ | 651 | 102 |
| Comparison example 1 | $Sr_{1.96}Si_5N_8:Eu_{0.04}$ | 632 | 100 |

(excitation wavelength: 450 nm)

Example 12

The Preparation Example of Luminescent Material $Sr_{0.86}Ca_{0.06}Si_{1.96}Al_{0.04}O_{2.04}N_{1.96}:Eu_{0.04}, Mn_{0.04}$ Comparison Example 2

A compound $Sr_{0.96}Si_2O_2N_2:Eu_{0.04}$ disclosed in U.S. Pat. No. 6,717,353 and patent WO 2004/030109

Figure 4:
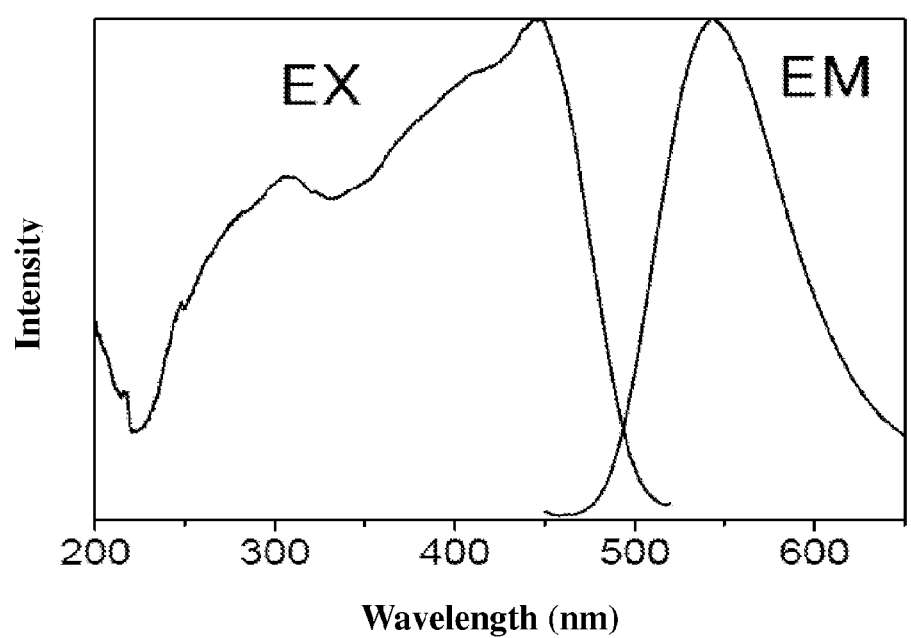
FIG. 4 is emission and excitation spectrum of example 12.

According to the above-mentioned proportion, $SrCO_3$ (51.03 g), $CaCO_3$ (2.10 g), $Al_2O_3$ (1.97 g), $Si_3N_4$ (28.00 g), $SiO_2$ (11.16 g), $MnCO_3$ (3.89 g) and $Eu(NO_3)_3$ (1.78 g) were mixed and ground to uniform level at the presence of n-hexane or anhydrous alcohol. Then the obtained mixture was loaded in alumina or borazon crucible and sintered in a pipe furnace. At normal pressure $N_2/H_2$ (95%/5%) is introduced in with the flow rate 3 L/min. 0.1 g $SrF_2$ was used as the fluxing agent. After maintained at 1300° C. for 15 hours, the obtained powder was ground followed by being sintered at the same condition again to accelerate the growth of crystalline grain. The sample was shattered, washed by hydrochloric acid to remove the involved impurity, and dried, giving 100 g green luminescent material of the present invention. FIG. 4 shows the emission spectrum and excitation spectrum of the product. As shown in FIG. 4, the emission spectrum of the luminescent material is wide and the full width at half maximum is about 30 nm, and the dominant peak occurs at about 554 nm that is in the region of green light. In addition, the excitation spectrum is so wide that it extends from ultraviolet region to visible-light region. As a result, the luminescent material can be excited effectively by ultraviolet light (300-420 nm) and blue light (420-490 nm) at the same time. The luminescent intensity is shown in table 2. As shown in table 2, the luminescent intensity of the luminescent material according to the present invention is stronger than or equal approximately to that of the sample in comparison example 2.

Example 23

Figure 5:
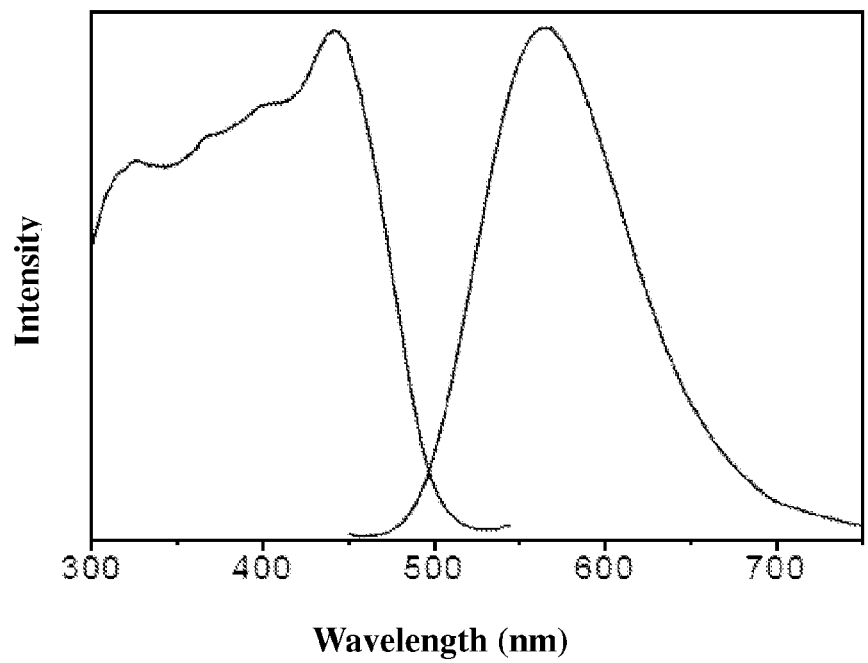
FIG. 5 is emission and excitation spectrum of example 23.

The Preparation Example of Luminescent Material $Ca_{0.90}Zn_{0.06}Si_{1.96}Al_{0.04}O_{2.04}N_{1.96}:Eu_{0.04}$ According to the above-mentioned proportion, $CaCO_3$ (43.72 g), ZnO (2.36 g), $Si_3N_4$ (35.23 g), $SiO_2$ (14.28 g), $Al_2O_3$ (0.99 g) and $Eu_2O_3$ (3.42 g) were mixed and ground to uniform level at the presence of n-hexane or anhydrous alcohol. Then the obtained mixture was loaded in borazon crucible and sintered in an auxiliary combustion chamber. $N_2$ with eight times of normal pressure is introduced in. After maintained at 1500° C. for 2 hours, the sample was shattered, washed by acid to remove the involved impurity, and dried, producing 100 g green luminescent material of the present invention. The related XRD pattern indicates that the crystal structure is almost identical to that of $CaSi_2O_2N_2$ (more than 95%). FIG. 5 shows the emission spectrum and excitation spectrum of the product. As shown in FIG. 5, the emission spectrum of the luminescent material is wide and the full width at half maximum is about 30 nm, and the dominant peak occurs at about 561 nm that is in the region of yellow light. In addition, the excitation spectrum is so wide that it extends from ultraviolet region to visible-light region. As a result, the luminescent material can be excited effectively by ultraviolet light (300-420 nm) and blue light (420-490 nm) at the same time. The luminescent intensity is shown in table 2. As shown in table 2, the luminescent intensity of the luminescent material according to the present invention is stronger than that of the sample in comparison example 2.

Example 37

Figure 6:
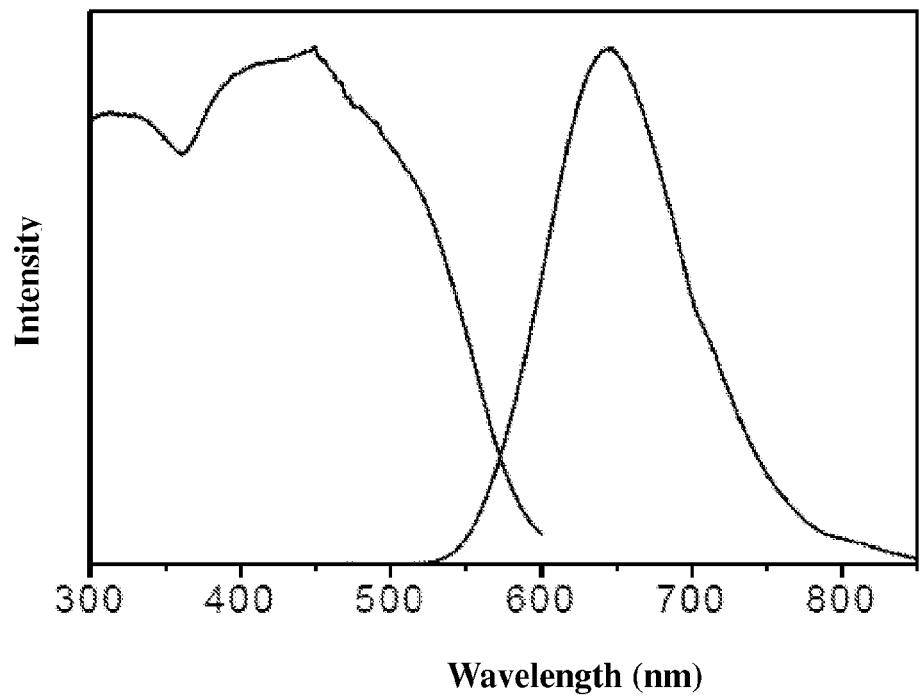
FIG. 6 is emission and excitation spectrum of example 37.

The Preparation Example of Luminescent Material $Ba_{0.90}Zn_{0.06}Si_{1.96}Al_{0.04}O_{2.04}N_{1.96}:Eu_{0.04}$ According to the above-mentioned proportion, $BaCO_3$ (60.48 g), ZnO (1.66 g), $Si_3N_4$ (24.74 g), $SiO_2$ (10.03 g), $Al_2O_3$ (0.70 g) and $Eu_2O_3$ (2.40 g) were mixed and ground to uniform level at the presence of n-hexane or anhydrous alcohol. Then the obtained mixture was loaded in alumina crucible and sintered in a pipe furnace. At normal pressure $N_2/H_2$ (95%/5%) is introduced in with the flow rate 1 L/min. 0.1 g $BaF_2$ was used as the fluxing agent. After maintained at 1400° C. for 10 hours, the obtained powder was ground followed by being sintered at the same condition again to accelerate the growth of crystalline grain. The sample was shattered, washed by hydrochloric acid to remove the involved impurity, and dried, giving 100 g green luminescent material of the present invention. FIG. 6 shows the emission spectrum and excitation spectrum of the product. As shown in FIG. 6, the emission spectrum of the luminescent material is wide and the full width at half maximum is about 30 nm, and the dominant peak occurs at 497 nm that is in the region of cyan light. In addition, the excitation spectrum is so wide that it extends from ultraviolet region to visible-light region. As a result, the luminescent material can be excited effectively by ultraviolet light (300-420 nm) and blue light (420-490 nm) at the same time. The luminescent intensity is shown in table 2. As shown in table 2, the luminescent intensity of the as-prepared luminescent material is approximately equal to that of the sample in comparison example 2.

Example 8-41

With reference to the chemical formula listed in table 2, example 8-11 were conducted as example 12, example 13-22 were conducted as example 23, example 24-36 and 38-41 were conducted as example 37. The luminescent intensity of the obtained products is shown in table 2.

TABLE 2

Chemical formula of the products in example 8-41 and luminescence property thereof

| Example | Chemical formula | Dominant peak of emission (nm) | Relative intensity % |
|---|---|---|---|
| 8 | $Sr_{0.90}Mg_{0.06}Si_2O_2N_2:Eu_{0.04}$ | 539 | 92 |
| 9 | $Sr_{0.86}Ca_{0.06}Si_2O_2N_2:Eu_{0.04}, Mn_{0.04}$ | 545 | 142 |
| 10 | $Sr_{0.90}Ba_{0.06}Si_2O_2N_2:Eu_{0.04}$ | 540 | 103 |
| 11 | $Sr_{0.96}Si_{1.96}B_{0.04}O_{2.04}N_{1.96}:Eu_{0.04}$ | 543 | 115 |
| 12 | $Sr_{0.86}Ca_{0.06}Si_{1.96}Al_{0.04}O_{2.04}N_{1.96}:Eu_{0.04}, Mn_{0.04}$ | 554 | 125 |
| 13 | $Sr_{0.86}Ba_{0.06}Si_{1.96}Al_{0.04}O_{2.04}N_{1.96}:Eu_{0.04}, Bi_{0.04}$ | 547 | 113 |
| 14 | $Sr_{0.70}Ca_{0.1}Ba_{0.1}Si_{1.96}Al_{0.04}O_{2.04}N_{1.96}:Eu_{0.04}$ | 546 | 104 |
| 15 | $Ca_{0.90}Sr_{0.06}Si_2O_2N_2:Eu_{0.04}$ | 562 | 103 |
| 16 | $Ca_{0.90}Ba_{0.06}Si_2O2N_2:Eu_{0.04}$ | 559 | 100 |
| 17 | $Ca_{0.92}Sr_{0.06}Si_2O_2N_2:Eu_{0.02}$ | 557 | 93 |
| 18 | $Ca_{0.86}Sr_{0.06}Si_2O_2N_2:Eu_{0.04}, Mn_{0.04}$ | 570 | 120 |
| 19 | $Ca_{0.84}Sr_{0.06}Si_2O_2N_2:Eu_{0.08}, Bi_{0.02}$ | 574 | 112 |
| 20 | $Ca_{0.90}Sr_{0.06}Si_2ON_{2.67}:Eu_{0.04}$ | 567 | 117 |
| 21 | $Ca_{0.90}Ba_{0.06}Si_2ON_{2.67}:Eu_{0.04}$ | 563 | 113 |
| 22 | $(Ca_{0.70}Sr_{0.1}Ba_{0.1})Si_2ON_{2.67}:Eu_{0.04}$ | 567 | 110 |
| 23 | $Ca_{0.90}Zn_{0.06}Si_{1.96}Al_{0.04}O_{2.04}N_{1.96}:Eu_{0.04}$ | 561 | 122 |
| 24 | $Ca_{0.96}Si_{1.96}Al_{0.04}O_{2.04}N_{1.96}:Eu_{0.04}$ | 564 | 104 |
| 25 | $Ca_{0.96}Si_{1.96}Ga_{0.04}O_{2.04}N_{1.96}:Eu_{0.04}$ | 563 | 101 |
| 26 | $Ca_{0.96}Si_{1.96}Ge_{0.04}O_2N_2:Eu_{0.04}$ | 562 | 99 |
| 27 | $Ca_{0.96}Si_{1.96}B_{0.04}O_{2.04}N_{1.96}:Eu_{0.04}$ | 567 | 108 |
| 28 | $Ca_{0.90}Sr_{0.06}Si_{1.96}Al_{0.04}O_{2.04}N_{1.96}:Eu_{0.04}$ | 565 | 130 |
| 29 | $Ca_{0.90}Ba_{0.06}Si_{1.96}Al_{0.04}O_{2.04}N_{1.96}:Eu_{0.04}$ | 560 | 125 |
| 30 | $(Ca_{0.70}Sr_{0.1}Ba_{0.1})Si_{1.96}Al_{0.04}O_{2.04}N_{1.96}:Eu_{0.04}$ | 565 | 103 |
| 31 | $Ba_{0.90}Ca_{0.06}Si_2O_2N_2:Eu_{0.04}$ | 503 | 102 |
| 32 | $Ba_{0.90}Sr_{0.06}Si_2O_2N_2:Eu_{0.04}$ | 493 | 110 |
| 33 | $Ba_{0.92}Sr_{0.06}Si_2O_2N_2:Eu_{0.02}$ | 485 | 86 |
| 34 | $Ba_{0.86}Sr_{0.06}Si_2O_2N_2:Eu_{0.04}, Mn_{0.04}$ | 506 | 92 |
| 35 | $Ba_{0.84}Sr_{0.06}Si_2O_2N_2:Eu_{0.10}$ | 510 | 84 |
| 36 | $Ba_{0.74}Sr_{0.06}Si_2O_2N_2:Eu_{0.20}$ | 516 | 78 |
| 37 | $Ba_{0.90}Zn_{0.06}Si_{1.96}Al_{0.04}O_{2.04}N_{1.96}:Eu_{0.04}$ | 497 | 108 |
| 38 | $Ba_{0.96}Si_{1.96}Al_{0.04}O_{2.04}N_{1.96}:Eu_{0.04}$ | 492 | 102 |
| 39 | $Ba_{0.90}Ca_{0.06}Si_{1.96}Al_{0.04}O_2.04N_{1.96}:Eu_{0.04}$ | 503 | 113 |
| 40 | $Ba_{0.90}Sr_{0.06}Si_{1.96}Al_{0.04}O_2.04N_{1.96}:Eu_{0.04}$ | 497 | 117 |
| 41 | $Ba_{0.70}Sr_{0.1}Ca_{0.1}Si_{1.96}Al_{0.04}O_{2.04}N_{1.96}:Eu_{0.04}$ | 495 | 107 |
| Comparison example 2 | $Sr_{0.96}Si_2O_2N_2:Eu_{0.04}$ | 550 | 100 |

(excitation wavelength: 450 nm)

Example 44

Figure 7:
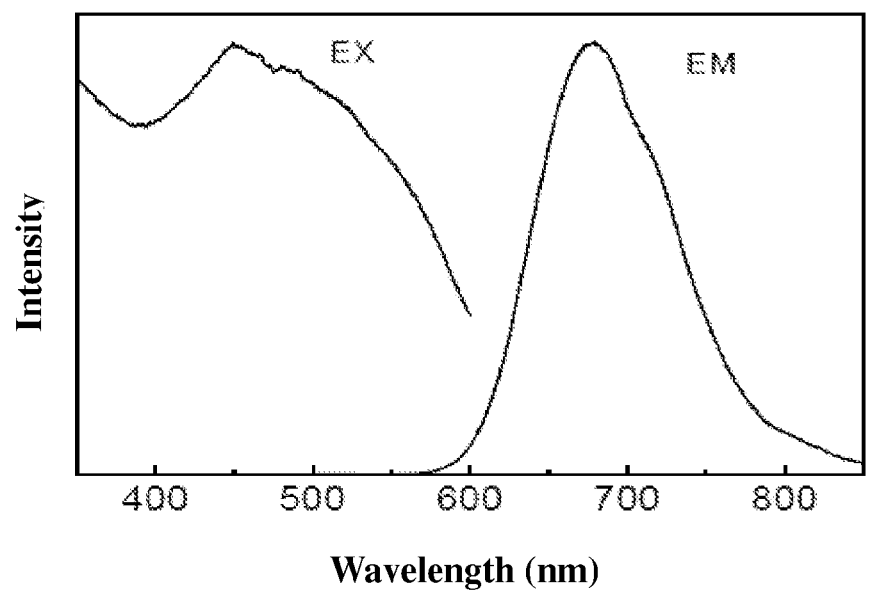
FIG. 7 is emission and excitation spectrum of example 44.

The Preparation Example of Luminescent Material $Ca_{0.86}Sr_{0.10}SiN_2:Eu_{0.04}$ According to the above-mentioned proportion, $Ca_3N_2$ (40.24 g), $Sr_3N_2$ (9.20 g), $Si_3N_4$ (44.26 g) and EuN (6.30 g) were added to a glove box, mixed and ground to uniform level. Then the obtained mixture was loaded in borazon crucible and sintered in a pipe furnace. At normal pressure $N_2$ is introduced in with the flow rate 2 L/min. 0.1 g $NH_4Cl$ was used as the fluxing agent. After maintained at 1800° C. for 0.5 hour, the obtained powder was ground followed by being sintered at the same condition again to accelerate the growth of crystalline grain. The sample was shattered, washed by hydrochloric acid to remove the involved impurity, and dried, giving 100 g red luminescent material of the present invention. FIG. 7 is the emission spectrum and excitation spectrum. As shown in FIG. 7, the emission spectrum is wide and the dominant peak occurs at 673 nm that is in the region of red light. In addition, the excitation spectrum is so wide that it extends from ultraviolet region to visible-light region. As a result, the luminescent material can be excited effectively by ultraviolet light (300-420 nm) and blue light (420-490 nm) at the same time. The luminescent intensity is shown in table 3.

Example 42-49

The luminescent materials represented by the chemical formula listed in table 3 were synthesized through the same preparation process in example 44. $NH_4Cl$ is used as the fluxing agent. The luminescent intensity of the obtained products is shown in table 3.

TABLE 3

Chemical formula of the products in example 42-49 and luminescence property thereof

| Example | Chemical formula | Dominant peak of emission (nm) | Relative intensity |
| --- | --- | --- | --- |
| 42 | $Ca_{0.96}SiN_2:Eu_{0.04}$ | 645 | 3200 |
| 43 | $Ca_{0.96}SiN_2:Ce_{0.02}Li_{0.02}$ | 661 | 3125 |
| 44 | $Ca_{0.86}Sr_{0.10}SiN_2:Eu_{0.04}$ | 673 | 3090 |
| 45 | $Ca_{0.86}Ba_{0.10}SiN_2:Eu_{0.04}$ | 650 | 3325 |
| 46 | $Ca_{0.76}Sr_{0.10}Ba_{0.10}SiN_2:Eu_{0.04}$ | 648 | 3230 |
| 47 | $Ca_{0.96}Si_{0.95}Al_{0.05}O_{0.05}N_{1.95}:Eu_{0.04}$ | 643 | 3002 |
| 48 | $Ca_{0.86}Sr_{0.10}Si_{0.95}Al_{0.05}O_{0.05}N_{1.95}:Eu_{0.04}$ | 652 | 3090 |
| 49 | $Ca_{0.86}Ba_{0.10}Si_{0.95}Al_{0.05}O_{0.05}N_{1.95}:Eu_{0.04}$ | 660 | 2980 |

(excitation wavelength: 450 nm)

Example 52

Fabrication of White Light LED as Electric Light Source

Figure 8:
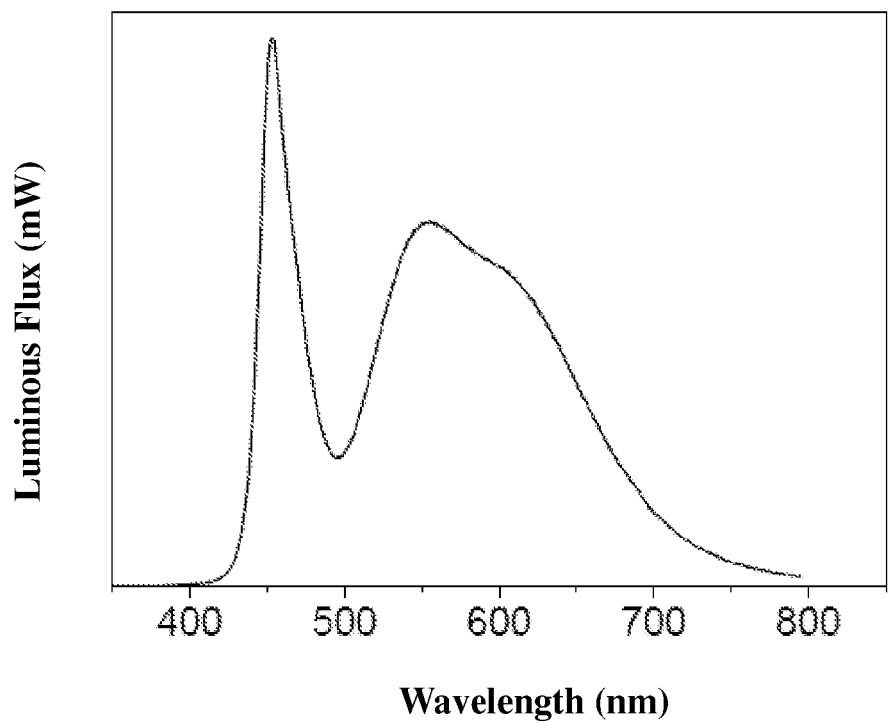
FIG. 8 is luminescent spectrum of white light LED of example 52.

Firstly, the red fluorescent powder prepared in example 4 and yellow fluorescent powder $(Tb_{1-x}Gd_x)_3(Al_{1-y}Ga_y)_5O_{12}$ (the preparation of the compound is disclosed in the patent publication with application number 200610113053.X and publication date Mar. 14, 2007) were dispersed into epoxy resin with variable proportion. After the mixed deaeration treatment, the as-obtained mixture was applied on commercial blue light LED (emission wavelength: 450 nm) chip. Then it was dried at 150° C. for 0.5 hour to complete the encapsulation. White light with color-coordinate of x=0.331 and y=0.342, coloration indexing Ra of 84, luminescence efficiency of 27 lm/W, and color temperature T of 5600K was produced through the combination of blue light that emitted from blue light LED with green light and red light that emitted from the fluorescent powder. The emission spectrum of the white light LED with color temperature of 5600K is shown in FIG. 8. While the coloration indexing remains equivalent, compared to the sulfide in comparison example, luminescence efficiency is improved by using the red fluorescent powder of oxynitride of the present invention. Moreover, the white light LED is excellent in durability and stable in luminescence efficiency.

Example 58

Fabrication of White Light LED as Electric Light Source

Figure 9:
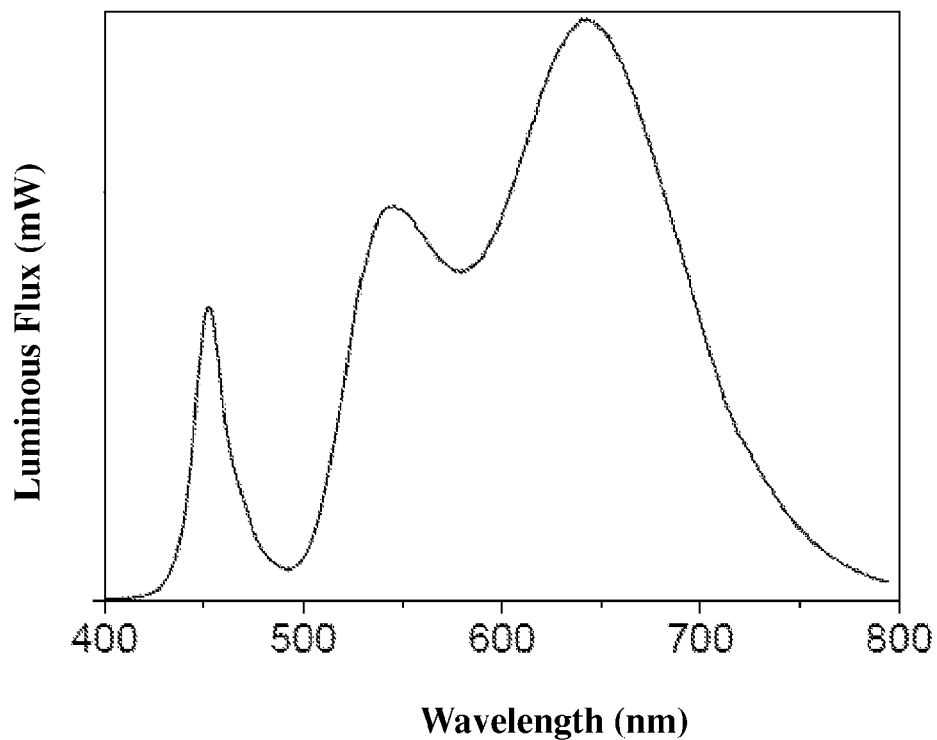
FIG. 9 is luminescent spectrum of white light LED of example 58.

The red fluorescent powder prepared in example 6 and green fluorescent powder prepared in example 12 were dispersed into epoxy resin with certain proportion. After the mixed deaeration treatment, the as-obtained mixture was applied on commercial blue light LED (emission wavelength: 450 nm) chip. Then it was dried at 150° C. for 0.5 hour to complete the encapsulation. White light with color-coordinate of x=0.452 and y=0.407, coloration indexing Ra of 86, luminescence efficiency of 33 lm/W, and color temperature T of 2732K was produced through the combination of blue light that emitted from blue light LED with green light and red light that emitted from the fluorescent powder. The emission spectrum of the white light LED with color temperature of 2732K is shown in FIG. 9. While the coloration indexing remains equivalent, compared to the sulfide in comparison example, luminescence efficiency is improved by using the red fluorescent powder of oxynitride of the present invention. Moreover, the white light LED is excellent in durability and stable in luminescence efficiency.

Example 59

Fabrication of White Light LED as Electric Light Source

Figure 10:
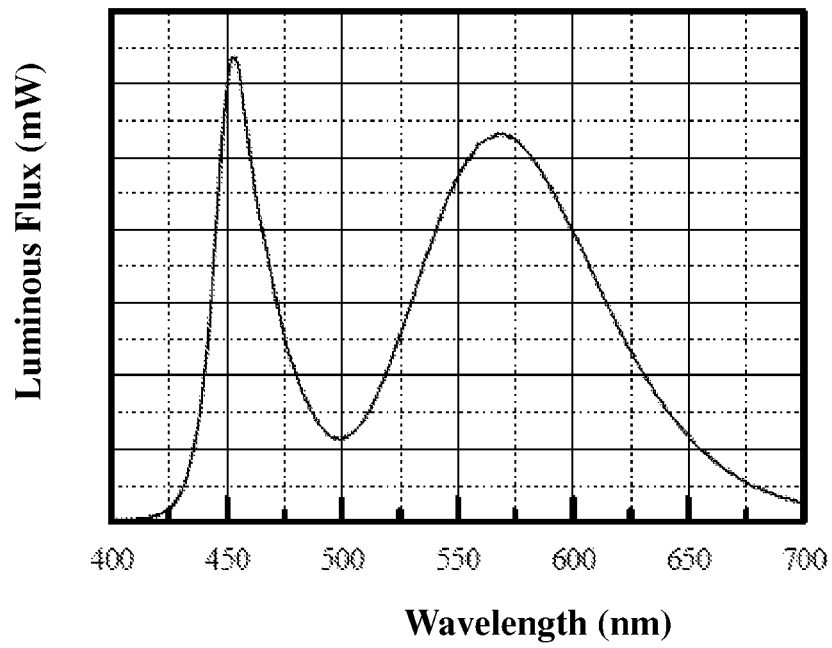
FIG. 10 is luminescent spectrum of white light LED of example 59.

The yellow fluorescent powder prepared in example 18 was dispersed uniformly into epoxy resin. After the mixed deaeration treatment, the as-obtained mixture was applied on commercial blue light LED (emission wavelength: 450 nm) chip. Then it was dried at 150° C. for 0.5 hour to complete the encapsulation. White light with color-coordinate of x=0.36-0.47 and y=0.36-0.42, coloration indexing Ra of 60-70, and color temperature T of 2600-5000K was produced through the combination of blue light that emitted from blue light LED with yellow light that emitted from the fluorescent powder. The emission spectrum of the white light LED with color temperature of 4032K is shown in FIG. 10.

Example 50-61

The fabrication of white light LED according to the examples in table 4 was realized, wherein example 50, 51, and 53 were conducted as example 52, example 54-57 were conducted as example 58, and example 60-61 were conducted as example 59. The ratio of the luminescent materials involved in each example could be achieved through simple test to one skilled in the art. The optical property of the as-generated white light LED is shown in table 4.

TABLE 4

Optical parameters of the white light LED

| White light LED | Example | Color-coordinate (x, y) | Coloration indexing | Color temperature (K) | Luminescence efficiency (lm/W) |
|---|---|---|---|---|---|
| Blue LED + red fluorescent powder of sulfide + YAG | Comparison example 3 | (0.324, 0.318) | 87 | 5936 | 24 |
| | Comparison example 4 | (0.375, 0.334) | 85 | 5404 | 24 |
| | Comparison example 5 | (0.350, 0.354) | 83 | 4842 | 24 |
| Blue LED + example 4 + TAG | Example 50 | (0.287, 0.273) | 87 | 11049 | 26 |
| | Example 51 | (0.310, 0.310) | 84 | 6848 | 27 |
| | Example 52 | (0.331, 0.342) | 84 | 5559 | 27 |
| | Example 53 | (0.461, 0.417) | 82 | 2756 | 25 |
| Blue LED + example 6 + example 12 | Example 54 | (0.312, 0.329) | 90 | 6504 | 35 |
| | Example 55 | (0.348, 0.353) | 92 | 4963 | 32 |
| | Example 56 | (0.377, 0.380) | 89 | 4100 | 34 |
| | Example 57 | (0.402, 0.392) | 88 | 3450 | 32 |
| | Example 58 | (0.452, 0.407) | 86 | 2732 | 33 |
| Blue LED + example 18 | Example 59 | (0.378, 0.374) | 60 | 4032 | 57 |
| | Example 60 | (0.440, 0.414) | 65 | 3000 | 54 |
| | Example 61 | (0.345, 0.358) | 70 | 5200 | 52 |

Example 62-65

Fabrication of White Light LED as Electric Light Source

Figure 11:
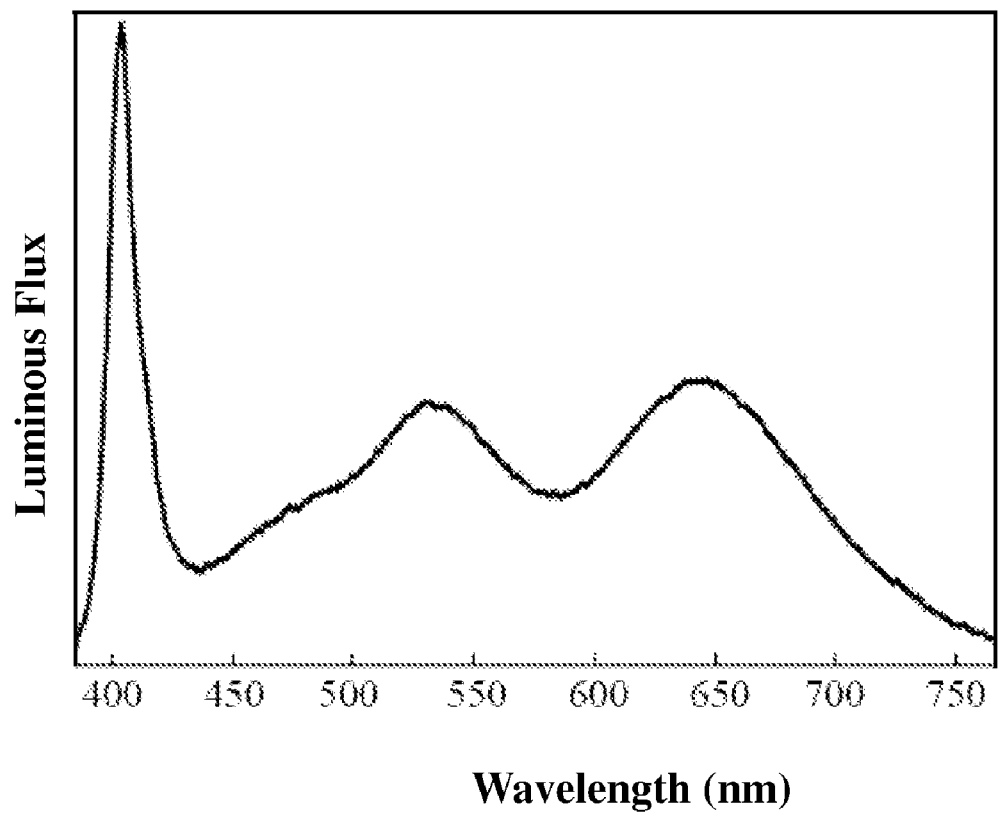
FIG. 11 is luminescent spectrum of white light LED of example 62.

The red fluorescent powder prepared in example 7 and green fluorescent powder prepared in example 14 and blue fluorescent powder prepared in example 33 were dispersed into epoxy resin with certain proportions. After the mixed deaeration treatment, the as-obtained mixture was applied on commercial ultraviolet light LED (emission wavelength: 405 nm) chip. Then it was dried at 150° C. for 0.5 hour to complete the encapsulation. White light with color temperature of 2800-6500K, coloration indexing of 90-96, and luminescence efficiency of 17-25 lm/W was produced through the combination of blue light, green light and red light that emitted from the fluorescent powder (the proportion of the luminescent materials can be achieved through simple test to one skilled in the art) excited by ultraviolet light LED. The results are shown in table 5. FIG. 11 illustrates the white light according to example 62 with color temperature T of 4560K, color coordinate of x=0.363 and y=0.386, coloration indexing Ra of 95, and luminescence efficiency of 23 lm/W. It is proved that oxynitride fluorescent powder can be excited by ultraviolet light LED to produce excellent white light LED.

TABLE 5

Optical parameters of the white light LED

| White light LED | Example | Color-coordinate (x, y) | Coloration indexing | Color temperature (K) | Luminescence efficiency (lm/W) |
|---|---|---|---|---|---|
| Near-ultraviolet LED (405 nm) + example 7 + example 4 + example 33 | Example 62 | (0.363, 0.386) | 95 | 4560 | 23 |
| | Example 63 | (0.312, 0.313) | 96 | 6740 | 22 |
| | Example 64 | (0.332, 0.340) | 94 | 5720 | 23 |
| | Example 65 | (0.459, 0.415) | 95 | 2720 | 25 |

What is claimed is:

1. An oxynitride luminescent material represented by the following chemical formula:

$$A_xB_yO_zN_{2/3x+4/3y-2/3z}:R,$$

wherein

A represents one or more elements selected from a bivalent metal,

B represents a silicon-group 13 component of two or more elements, where in one of the elements is Si and at least one of the other one or more elements is selected from the group consisting of B, Al, Ga, and In, R is a luminescence center element and comprises one or more elements selected from the group consisting of Eu, Ce, Mn, and Bi, and $1.0 \leq x \leq 3.0$; $1.0 \leq y \leq 6.0$; and $0 \leq z \leq 2.0$.

2. The oxynitride luminescent material according to claim 1, wherein said A includes one or more elements selected from the group consisting of Be, Mg, Ca, Sr, Ba, and Zn.

3. The oxynitride luminescent material according to claim 2, wherein said A includes Ca or a combination of Ca with Sr, and wherein said B includes Ga or a combination of Ga with Al.

4. A preparation method for an oxynitride luminescent material represented by the following chemical formula:

$$A_xB_yO_zN_{2/3x+4/3y-2/3z}:R,$$

wherein

A represents one or more elements selected from a bivalent metal,

B represents a silicon-group 13 component of two or more elements, wherein one of the two or more elements is Si and at least one of others of the two or more elements is selected from the group consisting of B, Al, Ga, and In, R is a luminescence center element and comprises one or more elements selected from the group consisting of Eu, Ce, Mn, and Bi, and $1.0 \leq x \leq 3.0$; $1.0 \leq y \leq 6.0$; and $0 \leq z \leq 2.0$, the method comprising:

selecting oxide, nitride, nitrate or carbonate of A, nitride or oxide of B, and nitride, oxide or nitrate of R as raw material;

mixing and grinding the raw material to obtain a homogeneous mixture;

sintering the homogeneous mixture under an inert gas atmosphere at an elevated temperature, wherein a sintered product is formed during a solid state reaction process; and generating the oxynitride luminescent material by shattering, removing the involved impurity, drying, and classifying the sintered product.

5. The method according to claim 4, wherein an anhydrous alcohol or n-hexane is added in the course of said grinding.

6. The method according to claim 4, wherein said inert gas during the solid state reaction process includes a mixture of nitrogen gas and hydrogen gas at a normal pressure, and wherein a volume ratio of the nitrogen gas to the hydrogen gas is approximately 95:5 and a flow rate is approximately 0.1-3 L/min.

7. The method according to claim 4, wherein said sintering is operated for approximately 0.5-30 hours at approximately 1200-1800° C., and is conducted time after time.

8. The method according to claim 4, wherein a fluxing agent is added to the raw material, wherein said fluxing agent is one or more compounds selected from boric acid or halogenide of A, and wherein an amount of said fluxing agent is approximately 0.01-10 percents of a weight based on a total weight of the raw material.

9. The method according to claim 4, wherein said removing the involved impurity includes acid washing or water washing.

10. A white light LED illumination or display light source having an oxynitride luminescent material represented by the following chemical formula:

$$A_xB_yO_zN_{2/3x+4/3y-2/3z}:R,$$

wherein

A represents one or more elements selected from a bivalent metal,

B represents a silicon-group 13 componenet of two or more elements, wherein one of the two or more elements is Si and at least one of others of the two or more elements is selected from the group consisting of B, Al, Ga, and In, R is a luminescence center element and comprises one or more elements selected from the group consisting of Eu, Ce, Mn, and Bi, and $1.0 \leq x \leq 3.0$; $1.0 \leq y \leq 6.0$; and $0 \leq z \leq 2.0$, comprising:

an ultraviolet or near-ultraviolet LED, and red, green and blue luminescent materials selected from the oxynitride luminescent material;

or a blue light LED, and yellow luminescent material selected from the oxynitride luminescent material;

or a blue light LED, and red and green luminescent materials selected from the oxynitride luminescent material;

or a blue light LED, red luminescent material selected from the above-mentioned oxynitride, and yellow luminescent material with Yttrium-Aluminium-Garnet crystal structure.

11. An oxynitride luminescent material represented by the following chemical formula:

$$A_xB_yO_zN_{2/3x+4/3y-2/3z}:R,$$

wherein

A represents one or more elements selected from a bivalent metal,

B represents a silicon-alkali metal component of two or more elements, where in one of the elements is Si and at least one of the other one or more elements is selected from the group consisting of Li and Na, R is a luminescence center element and comprises one or more elements selected from the group consisting of Eu, Ce, Mn, and Bi, and $1.0 \leq x \leq 3.0$; $1.0 \leq y \leq 6.0$; and $0 \leq z \leq 2.0$.

* * * * *